United States Patent [19]

Kim

[11] Patent Number: 5,516,714
[45] Date of Patent: May 14, 1996

[54] METHOD OF MAKING OUTPUT TERMINAL OF A SOLID-STATE IMAGE DEVICE

[75] Inventor: Beom-Shik Kim, Suwon, Rep. of Korea

[73] Assignee: SamSung Electronics Co., Ltd., Suwon, Rep. of Korea

[21] Appl. No.: 254,108

[22] Filed: Jun. 6, 1994

Related U.S. Application Data

[63] Continuation of Ser. No. 953,189, Sep. 29, 1992, Pat. No. 5,319,225, which is a continuation of Ser. No. 691,858, Apr. 26, 1991, abandoned.

[30] Foreign Application Priority Data

Dec. 11, 1990 [KR] Rep. of Korea .................. 20286/1990

[51] Int. Cl.⁶ ................................................ H01L 21/339
[52] U.S. Cl. ..................................... 437/53; 437/3; 437/7
[58] Field of Search .............................. 437/3, 7, 50, 53, 437/54, 59

[56] References Cited

U.S. PATENT DOCUMENTS

| | | | |
|---|---|---|---|
| 4,231,810 | 11/1980 | Jantsch et al. | 437/53 |
| 4,347,656 | 9/1982 | Smith et al. | 437/7 |
| 5,288,651 | 2/1994 | Nakazawa | 437/53 |

*Primary Examiner*—Chandra Chaudhari
*Attorney, Agent, or Firm*—Robert E. Bushnell

[57] ABSTRACT

A solid-state image device for outputting the charges transferred in one direction by given transfer clock is disclosed. It has a detection port for finally providing signal charges, a first active region of first conductivity for receiving the transferred charges, a second active region of second conductivity formed in the first active region with being connected to the detection port, and a third active region of second conductivity formed beneath the first active region with being connected to ground voltage terminal, whereby only the transferred signal charges are amplified to produce stable output signals with large gain. The first, second and third active regions together constitute amplifying means. The second active region is supplied with current by the charging operation of a reset transistor.

16 Claims, 5 Drawing Sheets

METHOD OF MAKING OUTPUT TERMINAL OF A SOLID-STATE IMAGE DEVICE

This is a continuation of application Ser. No. 07/953,189now U.S. Pat. No. 5,319,225, filed 29 Sep. 1992 which is a continuation of application Ser. No. 07/691,858, filed on Apr. 26, 1991 now abandoned.

TECHNICAL BACKGROUND

The present invention relates to an output device of a solid-state image device, particularly to an output terminal thereof.

The solid-state image device comprises a directional array of charge coupled devices (CCDs) horizontally or vertically arranged in series, whereby transferred signal charges are detected. Signals to be transferred are received by photodetectors such as photodiode. Exited electric charges by light energy are transferred through the directional array of CCDs, and an output signal is generated with amplification therefrom.

In the CCD, the charges are transferred from a potential well to adjacently potential well that is formed in a semiconductor region or channel region by applying a transfer clock to gates formed of polysilicon, isolated from the semiconductor region by insulating layer thereon, and having a given interval each other or one another.

Recently, a channel-buried-type CCD (BCCD) is widely used, wherein the charge transfer region is formed in a semiconductor region covered with an insulating layer thereon and beneath gate electrodes. The BCCD performs a wide variety of electronic functions such as image sensor, signal delay line, electronics apparatus using shift register, television camera, etc.

Such a BCCD has many problems to be solved in order to improve the charge transmission speed. The reliability thereof is based on the stability of the signal detected at the final output terminal. The circuit and construction concerning the output terminal of a BCCD is disclosed in "SOLID-STATE IMAGE DEVICE" published on March 26, Japan Sho Whoa 61-9975, "IEEE TRANSACTION ON ELECTRON DEVICE" VOL. 36, NO2, PP 360–366, FIGS. 1 and 8, published in February, 1989.

The above two prior construction employ reset transistors at the output terminal. FIGS. 1, 2A and 2B attached to this specification respectively represent a cross sectional view of the prior constructions, equivalent circuit thereof, and the output waveforms thereof.

Referring to FIGS. 1, 2A and 2B, there is formed in a P well 2 on a substrate an N–type layer 3 which embeds a potential forming P+ diffusion region 4 formed under a transfer gate 8, and N+ diffusion regions 5 and 6 constituting the source and drain of a field effect transistor. Namely, the N+ diffusion regions 5 and 6 and a reset gate 11 all together constitute an N–type reset transistor 576. Between the reset gate and transfer gates 8 and 9 is arranged a pass gate 10 connected to internal operating voltage $V_{DD}$.

The N+ diffusion region 5 that is the source of the N–type reset transistor 576 serves the output terminal of the BCCD, whose signal is amplified through a source follower amplifier 20 to produce final output $V_{OUT}$. The P–type well 2 and the N–type layer 3 of channel transfer region constitute a PN junction diode 25, of which cathode (N–type layer) is connected to the source 5 of the N–type reset transistor 576 and anode (P–type well) to ground voltage, as shown in FIG. 2A.

Also there exists a resistance 12 between the diode 25 and ground voltage. A detection port 53 is between the source 5 of the N–type reset transistor 576 and the cathode 3 of the diode 25. The input current $I_{IN}$ introduced to the detection port 53 is determined by the potential $V_{IN}$ of the transferred charges, and the signal applied from the detection port 53 to the source follower amplifier 20 varies with the clamping characteristic of the diode 25 and the on/off operation of the N–type reset transistor 576. The source follower amplifier 20 is a current-mirror-type amplifier comprised of two NMOS transistors 21 and 22 connected to internal voltage terminal $V_{DD}$, and of two ground connected transistors 23 and 24. The above described BCCD detection circuit having the diode 25 between the detection port 53 and ground voltage terminal is called a floating-diode amplifier (FDA).

Referring to FIG. 2B, if a transfer clock $\phi_H$ become "high" at time $t_1$, the transferred charges pass through the N–type layer (or channel region) under the pass gate 10 so as to the N+ diffusion region (or source) 5 of the reset transistor 576. At time $t_2$ if a reset pulse $\phi_{RG}$ of about 15 V are applied to the reset gate 11, the reset transistor 576 is turned on so that the output voltage $V_{OUT}$ of about 15 V is produced through the source follower amplifier 20. Thereafter, at time $t_3$ if the reset pulse $\phi_{RG}$ become "low" the electrons formed in the channel region 7 between the N+ diffusion regions 5 and 6 return to the N+ diffusion regions 5 and 6 so that the output voltage $V_{OUT}$ is dropped. This is called "feedthrough".

Assuming that the quantity of the signal charges is $Q_o$, the capacitance between the detection port 53 and P–type well 2 (or PN junction capacitance) C, the voltage gain of the source follower amplifier $A_V$, and the transfer conductance of the amplifying MOS transistor in the source follower amplifier gm, the output voltage gain $\Delta V$ is expressed as follows:

$$\Delta V = A_V \Delta V_A = (Q_o/C) \cdot gm \, R/(1+gm \, R) \tag{1}$$

wherein $\Delta V_A$ indicates the feedthrough level shown in FIG. 2B, and R the value of the resistance 12 shown in FIG. 2A. As a result, that the output voltage $V_{OUT}$ is dropped due to the feedthrough is caused by the fact that the charges formed in the channel 7 are partly distributed to the parasitic capacitor of the PN junction. Namely, as the PN junction capacitance C is increased, the output voltage gain $\Delta V$ is decreased. Moreover, it is advantageous that the quantity $Q_o$ of the signal charges applied to the detection port 53 is great, for the source follower amplifier may critically respond to the general frequency noises if the quantity is small.

Further, in the above circuit, kTC noises (reset noises) are mixed with the output signal because of the switching operation of the reset transistor. The kTC noises are caused by the electron energy fluctuation that is in turn caused by the fact that when the reset pulse kept to be in the high voltage of about 15 V for a brief time is dropped to 0 V, they are switched with a large swing width so that the electrons in the channel 7 return to the N+ diffusion regions 5 and 6 (or source and drain regions). The kTC noises are small in magnitude, but considerably influencing the transferred signal of insufficient quantity. Description concerning the kTC noises (reset noises) are disclosed in the above "SOLID-STATE IMAGE DEVICE", pp 140–145.

SUMMARY OF THE INVENTION

It is an object of the present invention to provide an output terminal of a solid-state image device using BCCD, whereby the output terminal producing stabilized output signals.

It is another object of the present invention to provide an output terminal of a solid-state image device which may produce output signal charges of sufficient quantity without using an external amplifying means.

According to the present invention, a solid-state image device for outputting the charges transferred in one direction by given transfer clock comprises a detection port for finally providing signal charges, a first active region of first conductivity for receiving the transferred charges, a second active region of second conductivity formed in the first active region, with being connected to the detection port, and a third active region of second conductivity formed beneath the first active region, with being connected to ground voltage terminal.

BRIEF DESCRIPTION OF ATTACHED DRAWINGS

The foregoing and other objects, aspects and advantages of the invention will be better understood from the following detailed description of the preferred embodiment of the invention with reference to the accompanying drawings, in which.

DETAILED DESCRIPTION OF A PREFERRED EMBODIMENT OF THE PRESENT INVENTION

Figure 1:
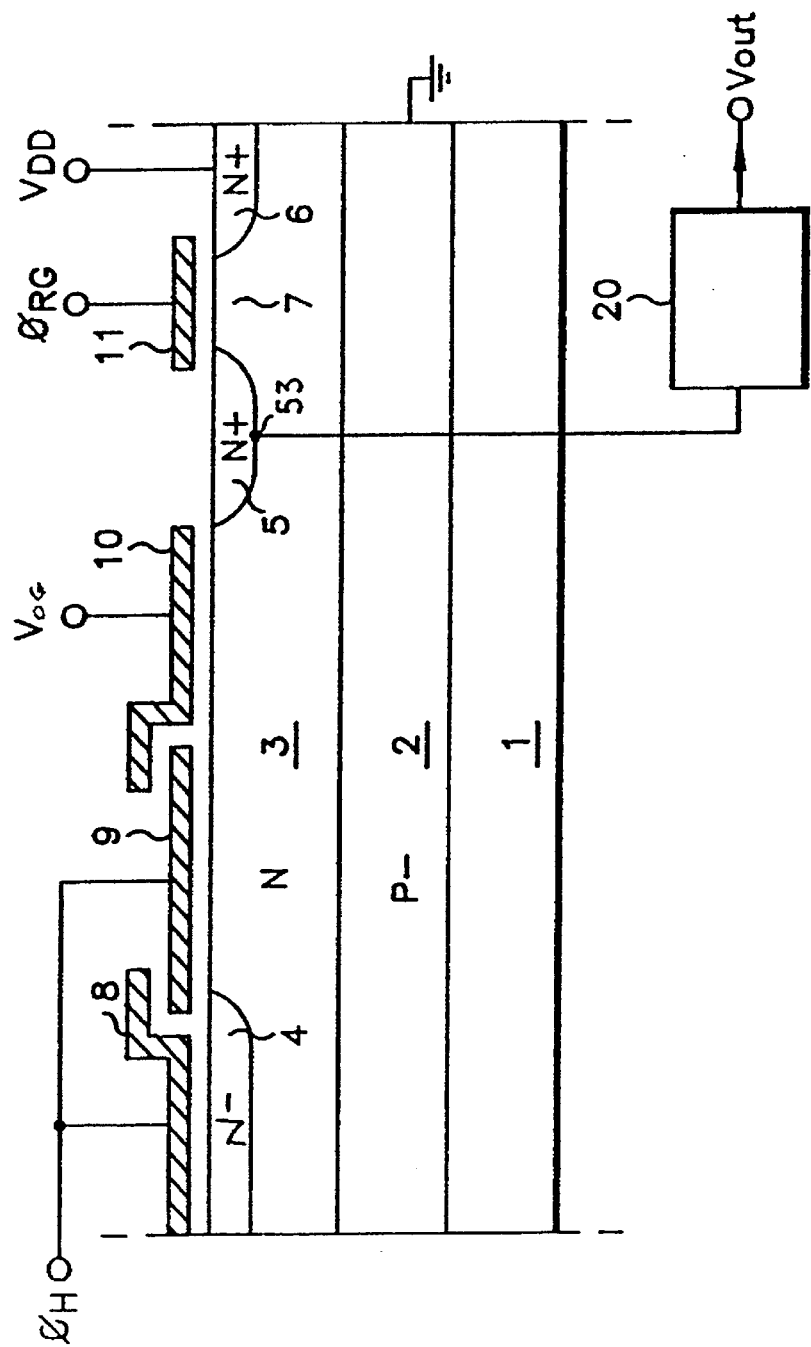
FIG. 1 is a cross sectional view of the structure of the output section of a conventional BCCD.
Figure 2A:
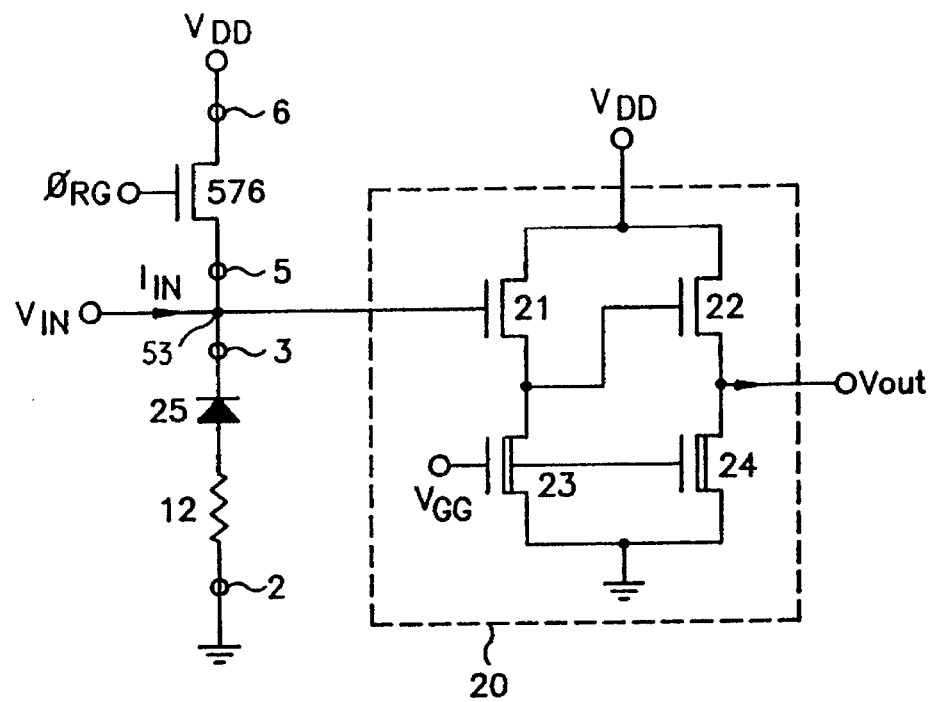
FIG. 2A is an equivalent circuit according to FIG. 1.
Figure 2B:
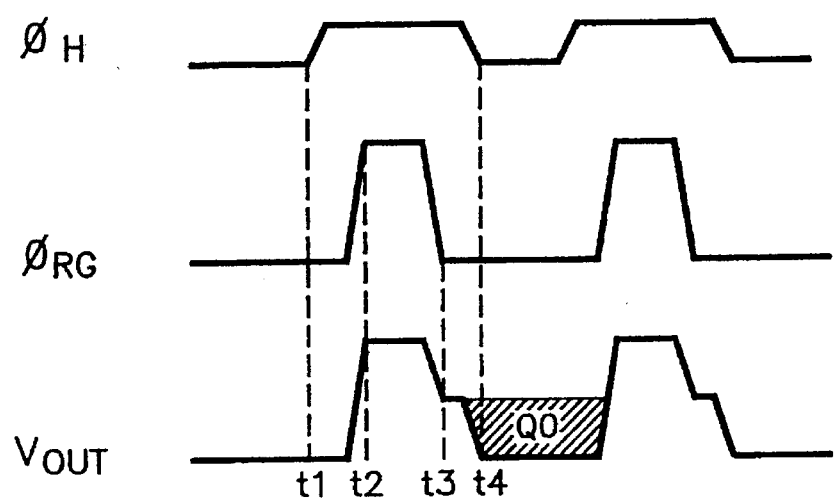
FIG. 2B illustrates the operational waveforms of the conventional circuit of FIG. 1.
Figure 3:
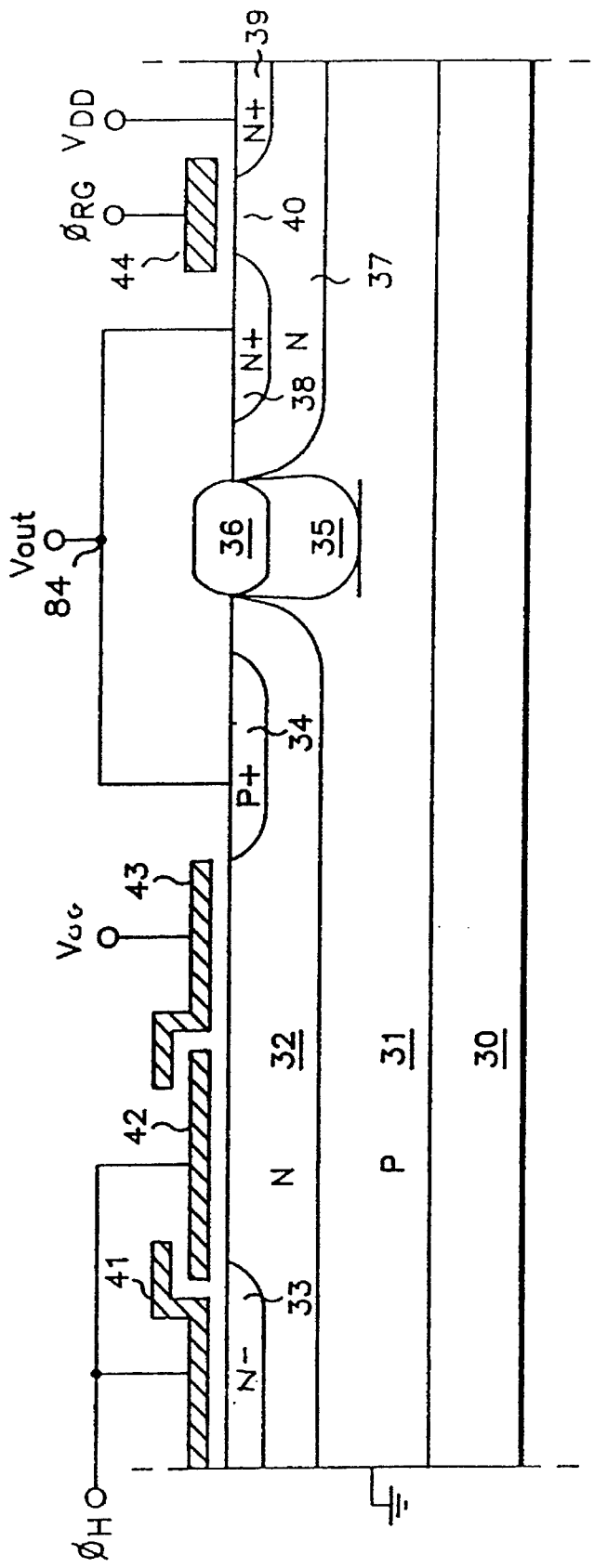
FIG. 3 is a cross sectional view of the structure of the output section of a BCCD according to the present invention.

Referring to FIG. 3, substrate 30, P-type well 31 (or possibly epitaxial layer), left N− layer 32, P+ diffusion region 33 for forming a potential, transfer gates 41 and 42, and pass gate 43 are same as those of FIG. 1. The P+ diffusion region 34 and N+ diffusion region 38 respectively formed in the left N− layer 32 and right N− layer 37 are commonly connected to voltage output terminal $V_{OUT}$. The left N− layer 32 and right N− layer 37 are separated by both isolation oxide layer 36 and P+ channel stopper region 35 beneath it. Within a part of the topmost of the right N− layer 37, with a given depth, are formed the N+ diffusion region 38 and another N+ diffusion region 39 that constitute an NMOS transistor with a reset gate 44. The P-type well 31, left N− layer 32 and P+ diffusion region 34 constitute a PNP bipolar transistor. The left N− layer 32 serves both the channel transfer region and the base of the PNP bipolar transistor.

Figure 4:
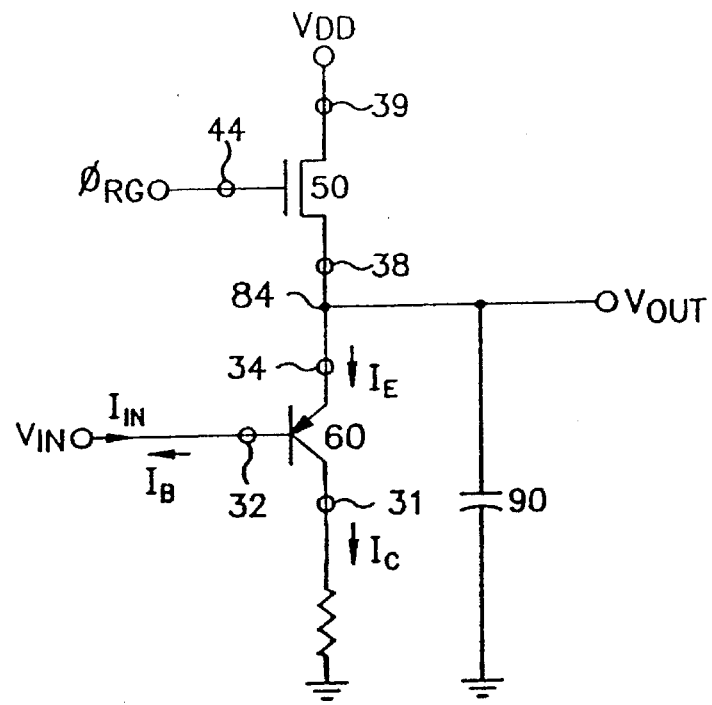
FIG. 4 is an equivalent circuit according to FIG. 3.

Referring to FIG. 4, the inventive detection circuit comprises a reset transistor 50, PNP bipolar transistor 60, resistance 70, detection port, and coupling capacitor 90. The reset transistor 50 consists of a reset gate 44, source and drain regions of N+ diffusion regions 38 and 39, and channel region 40, as shown in FIG. 3.

The PNP bipolar transistor 60 consists of the P-type well 31, channel transfer region of the left N− layer 32 and P+ diffusion region 34, as shown in FIG. 3. The resistance 70 is a parasitic resistance formed between the P+ well 31 and ground voltage terminal.

The detection port 84 commonly is connected to both the P+ diffusion region 34 and the N+ diffusion region 38, as shown in FIG. 3, to finally detect the output voltage. The coupling capacitor 90 exists between lines or between lines and lower conduction layer when extending an output line, and is an important factor for determining the characteristics of the inventive detection circuit. The output voltage $V_{OUT}$ varies with the charges accumulated in the coupling capacitance 90.

Figure 5:
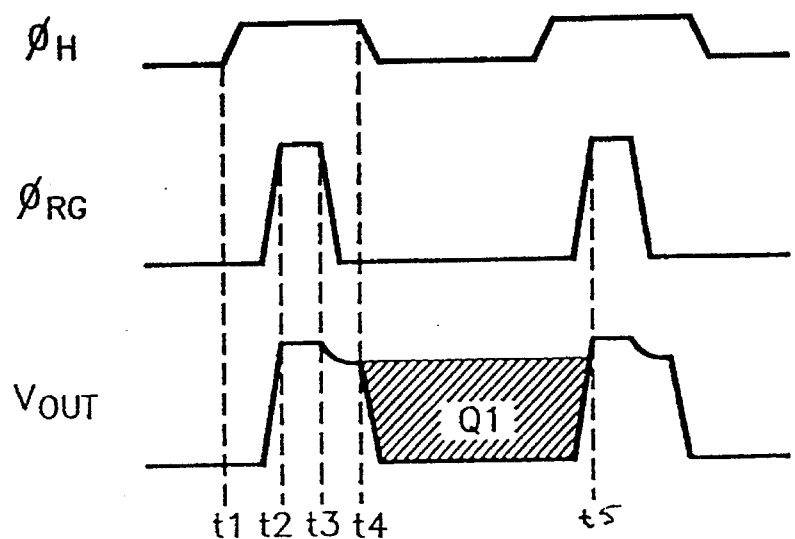
FIG. 5 illustrates the operational waveforms of the inventive circuit.

Referring to FIG. 5, the relationship between the transfer clock $\phi_H$, a reset pulse $\phi_{RG}$ and output voltage $V_{OUT}$ is illustrated with reference to times $t_1$, $t_2$, $t_3$, $t_4$ and $t_5$ respectively indicating time of enabling of the transfer clock $\phi_H$, enabling of the reset pulse $\phi_{RG}$ disabling of the reset pulse $\phi_{RG}$, disabling of the transfer clock $\phi_H$ and setting up of the output voltage $V_{OUT}$ in the next page.

Figure 6:
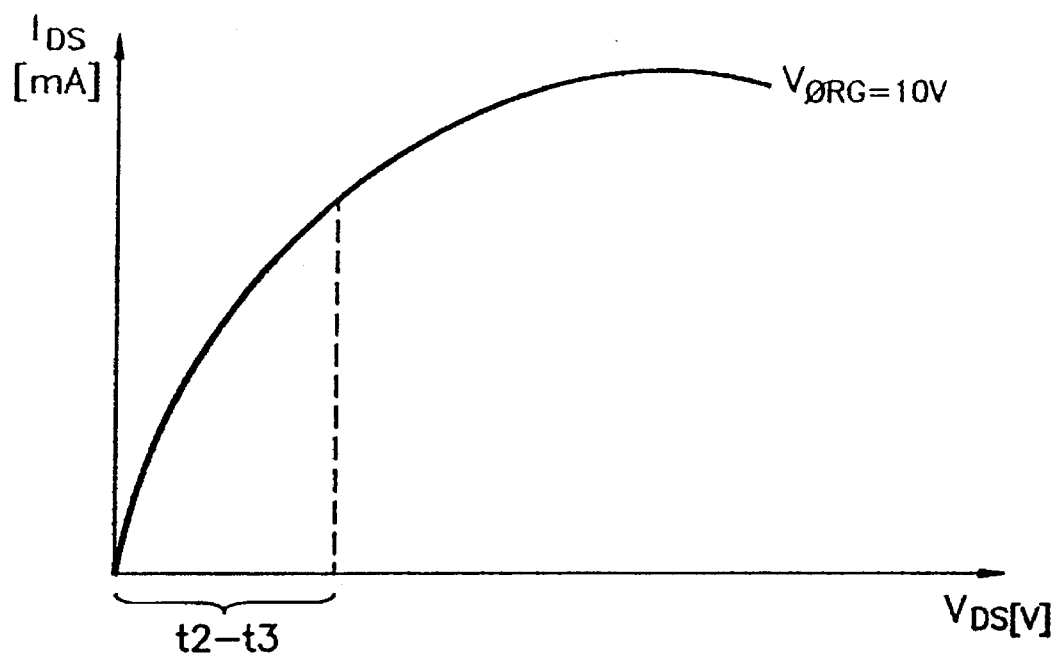
FIG. 6 is a graph for illustrating the current-voltage characteristics of the reset transistor 50 of FIG. 4.

Referring to FIG. 6 for illustrating the voltage $V_{DS}$ characteristics of current $I_{DS}$ when the reset pulse $\phi_{RG}$ of 10 to 15 V are applied to the reset transistor 50, a linear drain-source current $I_{DS}$ flows in the source 38 of the reset transistor 50 connected to the detection port 84 because of high level of the reset pulse $\phi_{RG}$. This current charges the coupling capacitor 90 for the time $t_2$–$t_3$ of applying the reset pulse $\phi_{RG}$.

Figure 7:
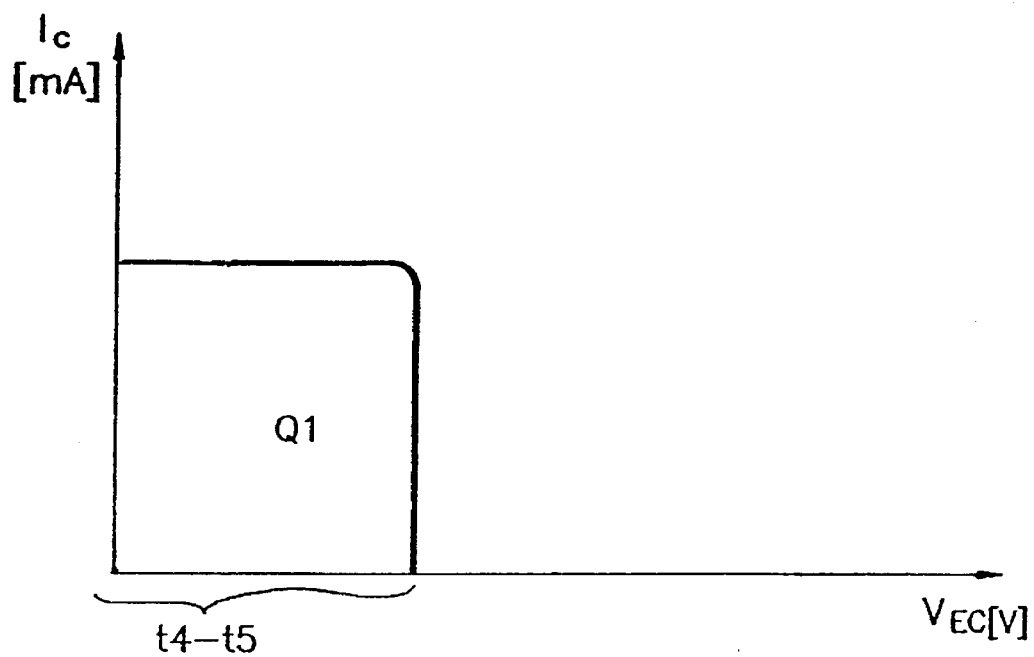
FIG. 7 is a graph for illustrating the current-voltage characteristics of the PNP bipolar transistor 60 of FIG. 4.

Referring to FIG. 7 for illustrating the amplification of the PNP bipolar transistor 60 according to the present invention, the region $Q_1$ enclosed by the curve illustrating relation between the collector emitter voltage $V_{CE}$ and the collector current $I_C$ for the time $t_4$–$t_5$ of amplification represents the amount of the output current amplified by the current (emitter current of the PNP bipolar transistor) discharged from the coupling capacitor 90.

Hereinafter will now be described the operation of the inventive circuit, based on the above description.

At time $t_1$ if the transfer clock $\phi_H$ is "high" the transferred charges are delivered to the base 32 of the PNP bipolar transistor 60. The transferred charges form the base current and are captured by the pass gate 43 during the time that the transfer clock $\phi_H$ are disabled, and then enabled in the next stage. Thereafter, at time $t_2$ when the reset pulse $\phi_{RG}$ of 10–15 V are applied to the reset gate 44 of the reset transistor 50, the reset transistor is made greatly conductive, so that the drain-source current $I_N$ is increased with good linearity.

As shown in FIG. 6, since the voltage source (10 to 15 V) of the reset pulses $\phi_{RG}$ meets the condition $V_{GS}$–$V_{TN}$>$V_{DS}$ ($V_{GS}$: gate voltage, namely the voltage of the reset pulses $\phi_{RG}$; $V_{DS}$: drain-source voltage; and $V_{IN}$: threshold voltage), great amount of current flows to the detection port 84 connected to the source 38 to the saturation point of $V_{GS}$–$V_{TN}$=$V_{DS}$ during the time ($t_2$–$t_3$) that the reset pulse $\phi_{RG}$ is applied.

The current obtained by the reset transistor 50 charges the coupling capacitor 90 existing in the detection port 84, so that the level of the output voltage $V_{out}$ across the coupling capacitor 90 is increased.

Then, at time $t_3$ if the reset pulse $\phi_{RG}$ are disabled, the drain-source current $I_{DS}$ of the reset transistor 50 begins to be decreased with somewhat lowering the level of the output voltage $V_{OUT}$. This is a feedthrough phenomenon occurring when the charges formed in the channel region 40 of the reset transistor 50 with the applied reset pulse $\phi_{RG}$ are absorbed by both the N+ diffusion regions 38 and 39 shown in FIG. 3. The feedthrough level is relatively reduced compared with the conventional circuit.

If there is blocked the charging passage between the internal voltage source $V_{DD}$ and detection port 84 due to disabling of the reset pulse $\phi_{RG}$, the coupling capacitor 90 starts to discharge the previously charged voltage.

The current by the discharging of the capacitor 90 directly becomes the emitter current $I_E$ of the PNP bipolar transistor 60, thus operating it. The PNP bipolar transistor 60 starts to operate at the moment when the transfer clock pulses $\phi_H$ are disabled at time $t_4$ so as to cause the charges captured under the pass gate 43 to be consumed as the base current $I_B$ of the PNP bipolar transistor 60 and the emitter current $I_E$ starts to be introduced into the detection port 84 by discharging of the coupling capacitor 90.

Referring to FIG. 7, since the PNP bipolar transistor 60 operates in the saturation region SAT, the emitter-collector voltage $V_{BC}$ is not considerably increased even with a large collect current $I_C$. The reason is that the emitter-collector junction of the PNP bipolar transistor 60 is forwardly biased, so that the base absorbs the electrons from the collector. In other words, the emitter-collector voltage $V_{BC}$ becomes equal to $V_{BC}-V_{CB}$ due to the forward biased emitter-collector junction.

Thereafter, if the emitter-collector junction is reversely biased, $V_{BC}$ becomes equal to $V_{EB}+V_{BC}$, so that the PNP bipolar transistor 60 operates in the active region ACT of increasing $V_{BC}$. In this case the region $Q_1$ enclosed by the functional curve and horizontal axis in FIG. 7 represents the amplified amount of the transferred signal charges, corresponding to the region $Q_1$ of FIG. 5.

Thus the PNP bipolar transistor 60 amplifies the signal charges and the transferred charges collected in the base are all consumed, and then the PNP bipolar transistor 60 is turned off.

The charges transferred by one pulse of transfer clock pulse $\phi_H$ are reduced by one to the amplification factor $\beta(I_C/I_B)$ of the PNP bipolar transistor 60. The base and collector currents $I_B$ and $I_C$ of the PNP bipolar transistor 60 are inversely proportional to the output voltage $V_{OUT}$.

It will be apparent to one skilled in the art that the sufficiently amplified signal charges are hardly influenced by the frequency noises generated at the output terminal.

The present embodiment employs the PNP bipolar transistor 60 as the amplifying means, but it is possible to use other devices applicable to the structure of FIG. 3 for accomplishing the present invention.

As described above, the present invention makes it possible to amplify the signal charges transferred to the final stage of a BCCD to obtain stable output signals without using an external amplifier, thus improving the integrability of a solid-state image device.

Furthermore the present invention amplifies only the transferred signal charges by means of least component elements, so that the final output signal is hardly influenced by the noises of the output terminal.

What is claimed is:

1. A method for making a solid-state image device, comprising the steps of:

forming a first active layer of a first conductivity type on a semiconductor substrate;

forming a second active layer of a second conductivity type formed on said first active layer, for serving as an electric charge transfer region, said second active layer having first and second portions separated and spaced-apart by a stopper region;

dispersing first impurities in a selected area of said first portion of said second active layer to form a first diffusion region, said first diffusion region facing toward said stopper region;

dispersing second impurities in selected areas of said second portion of said second active layer to form second and third diffusion regions, said second and third diffusion regions being spaced-apart by a channel region, said third active region serving as an internal voltage source;

forming a plurality of spaced-apart gate electrodes over said first portion of said second active layer, for providing electric charges in dependence upon a transfer clock pulse and a pass voltage, said transfer clock pulse representing electric charges to be delivered to said first and second active regions via said second active layer;

forming a reset gate over said second and third diffusion regions of said second portion of said second active layer, for providing a reset clock pulse in dependence upon said transfer clock pulse; and connecting an output terminal to said first and second diffusion regions, for outputting said electric charges in dependence upon said transfer clock pulse and said reset clock pulse.

2. The method as claimed in claim 1, wherein said first conductivity type is a P–type and said second conductivity type is a N–type.

3. The method as claimed in claim 1, wherein said first diffusion region is formed by P–type materials, and said second and third diffusion regions are formed by N–type materials.

4. A method for making a solid-state image device, comprising the steps of:

forming a first active layer of a first conductivity type on a substrate;

forming a second active layer of a second conductivity type on said first active layer, said second active layer having first and second portions separated and spaced-apart by a stopper region;

forming a first diffusion region in said first portion of said second active layer, said first active layer, said first portion of said second active layer and said first diffusion region forming a first transistor for amplifying electric charges in dependence upon transfer clock pulses;

forming second and third diffusion regions in said second portion of said second active layer, said second diffusion region being separated and spaced-apart from said third diffusion region by a channel region, said second and third diffusion regions and said channel region forming a second transistor for regulating amplified electric charges provided from said first transistor in dependence upon reset clock pulses;

disposing a transfer gate electrode over said first portion of said second active layer to receive said transfer clock pulses, for controlling operation of said first transistor;

disposing a reset gate electrode over said channel region to receive said reset clock pulses, for controlling operation of said second transistor; and connecting an output terminal to said first and second diffusion regions, for providing a stabilized output voltage corresponding to the amplified electric charges when said second transistor is turned-off.

5. The method as claimed in claim 4, wherein said first conductivity type is a P–type, said second conductivity type is a N–type, said first diffusion region is formed by P+type materials, and said second and third diffusion regions are formed by N+type materials.

6. The method as claimed in claim 4, wherein said first transistor is a bipolar transistor, and said first active layer, said first portion of said second active layer and said first diffusion region correspond to a collector, a base and an emitter of said bipolar transistor, respectively.

7. The method as claimed in claim 4, wherein said second transistor is a field effect transistor, and said second and third diffusion regions and said reset gate electrode correspond to a source, a drain and a gate of said field effect transistor, respectively.

8. A method for making a solid-state image device, comprising the steps of:

forming a transfer transistor on a substrate, said transfer transistor having a collector region, a base region and an emitter region respectively formed on said substrate, for transferring and amplifying electric charges;

disposing a transfer gate over said base region of said transfer transistor to receive transfer clock pulses, for controlling operation of said transfer transistor in dependence upon said transfer clock pulses;

disposing a reset transistor on said substrate, said reset transistor having a source region, a drain region and a channel region respectively disposed on said substrate, for regulating amplified electric charges provided from said transfer transistor;

disposing a reset gate over said channel region of said reset transistor and coupled to receive said reset clock pulses, for controlling operation of said reset transistor; and connecting an output terminal to said source region of said reset transistor and said emitter region of said transfer transistor, and providing a stabilized output voltage corresponding to the amplified electric charges when said reset transistor is turned-off.

9. The method as claimed in claim 8, wherein said first conductivity type is a P–type, said second conductivity type is a N–type, said first diffusion region is formed by materials of P+type, and said second and third diffusion regions are formed by materials of N+type.

10. A method for making a solid-state image device, comprising the steps of:

forming a first active layer of a first conductivity type on a semiconductor substrate;

forming a second active layer comprising a first section and a second section of a second conductivity type formed on said first active layer, said first and second sections being separated by a stopper region;

forming a first diffusion region in said first section of said second active layer adjacent to said stopper region and connected to an output terminal, said first active layer, said first section of said second active layer and said first diffusion region forming a first transistor for amplifying electric charges in response to a transfer clock pulse;

disposing a transfer electrode over said first section, for controlling the electric charges when said transfer clock pulse is high;

forming second and third diffusion regions in said second section of said second active layer, said second and third diffusion regions being spaced-apart by a channel region, said second diffusion region being connected to the output terminal, and said third active region being connected to an internal voltage terminal for providing an internal voltage, said second and third diffusion regions and said channel region forming a second transistor for regulating the amplified electric charges in response to a reset clock pulse; and disposing a reset electrode over said channel region between said second and third diffusion regions, for controlling the regulated electric charges when said reset clock pulse is high.

11. The method as claimed in claim 10, wherein said first conductivity type is a P–type and said second conductivity type is a N–type, said first diffusion region is formed by P–type materials, and said second and third diffusion regions are formed by N–type materials.

12. The method as claimed in claim 10, wherein said first transistor is a bipolar PNP transistor, and said first active layer, said first section of said second active layer and said first diffusion region correspond to a collector, a base and an emitter of said bipolar transistor, respectively.

13. The method as claimed in claim 10, wherein said second transistor is a field effect NMOS transistor, and said second and third diffusion regions and said reset electrode correspond to a source, a drain and a gate of said field effect transistor, respectively.

14. A method for providing a stabilized output voltage, comprising the steps of:

generating a transfer clock pulse in an "ON" state at a first time interval at a transfer gate electrode for controlling operation of a transfer transistor in response to the transfer clock pulse, and thereby causing a transfer transistor formed on a substrate for transferring amplifyed electric charges to turn off;

generating a reset clock pulse in an "ON" state at a second time interval at a reset gate electrode for controlling operation of a reset transistor for regulating the amplified electric charges in response to the reset clock pulse, causing said reset transistor to turn on, charging with a drain-source current of said reset transistor, coupled to an output terminal, and producing an output signal at said output terminal;

changing the reset clock pulse to an "OFF" state at a third time interval, causing the reset transistor to turn off, and producing said output signal via feedthrough; and changing the transfer clock pulse to an "OFF" state at a fourth time interval, causing the transfer transistor to turn on, discharging the capacitor with a collector current of said transfer transistor, and producing said output signal at said output terminal stabilized via said discharging of the capacitor.

15. A method for fabricating a solid-state image device, comprising the steps of:

forming a first active layer of a first conductivity type on a substrate;

forming a second active layer of a second conductivity type on said first active layer, said second active layer comprising first and second portions separated and spaced-apart by a stopper region;

dispersing first impurities in a selected area of said first portion of said second active layer in a well form to form a first diffusion region, said first diffusion region facing toward said stopper region;

dispersing second impurities in selected areas of said second portion of said second active layer in a well-form to form second and third diffusion regions, said second and third diffusion regions being spaced-apart by a channel region;

forming a plurality of spaced-apart gate electrodes over said first portion of said second active layer;

forming a reset gate over said second and third diffusion regions of said second portion of said second active layer; and connecting an output terminal to said first and second diffusion regions.

16. The solid-state image device as claimed in claim 15, wherein said first conductivity type is a P–type and said second conductivity type is a N–type.

* * * * *